United States Patent
Bhat et al.

(10) Patent No.: US 10,199,549 B2
(45) Date of Patent: Feb. 5, 2019

(54) LIGHT EMITTING DEVICE WITH AN OPTICAL ELEMENT AND A REFLECTOR

(71) Applicant: Lumileds LLC, San Jose, CA (US)

(72) Inventors: Jerome Chandra Bhat, San Jose, CA (US); Grigoriy Basin, San Jose, CA (US); Kenneth Vampola, San Jose, CA (US)

(73) Assignee: Lumileds LLC, San Jose, CA (US)

(*) Notice: Subject to any disclaimer, the term of this patent is extended or adjusted under 35 U.S.C. 154(b) by 0 days.

(21) Appl. No.: 14/891,332

(22) PCT Filed: May 15, 2014

(86) PCT No.: PCT/IB2014/061448
§ 371 (c)(1),
(2) Date: Nov. 14, 2015

(87) PCT Pub. No.: WO2014/184757
PCT Pub. Date: Nov. 20, 2014

(65) Prior Publication Data
US 2016/0087174 A1    Mar. 24, 2016

Related U.S. Application Data (60) Provisional application No. 61/823,419, filed on May 15, 2013.

(51) Int. Cl.
*H01L 33/60* (2010.01)
*H01L 33/58* (2010.01)
(Continued)

(52) U.S. Cl.
CPC .............. *H01L 33/60* (2013.01); *H01L 33/50* (2013.01); *H01L 33/58* (2013.01); *H01L 33/44* (2013.01);
(Continued)

(58) Field of Classification Search
CPC .......... H01L 33/60; H01L 33/58; H01L 33/46; H01L 2933/0058
See application file for complete search history.

(56) References Cited

U.S. PATENT DOCUMENTS

| 7,009,213 B2 | 3/2006 | Camras et al. |
| 7,858,408 B2 | 12/2010 | Mueller et al. |

(Continued)

FOREIGN PATENT DOCUMENTS

| CN | 101160670 A | 4/2008 |
| CN | 101673796 A | 3/2010 |

(Continued)

OTHER PUBLICATIONS

EPO as ISA, PCT/IB14/61448, "International Search Report", dated Aug. 26, 2014, 3 pages.

(Continued)

*Primary Examiner* — Stephen W Smoot
*Assistant Examiner* — Sun Mi Kim King
(74) *Attorney, Agent, or Firm* — Volpe and Koenig, PC (57) ABSTRACT

A structure according to embodiments of the invention includes a semiconductor light emitting device and an optical element disposed over the semiconductor light emitting device. The semiconductor light emitting device is disposed in a recess in the optical element. A reflector is disposed on a bottom surface of the optical element. A method according to embodiments of the invention includes disposing a semiconductor light emitting device on a substrate and forming a reflector adjacent the semiconductor light emitting device. An optical element is formed over the semiconductor light emitting device. The semiconductor light emitting device is removed from the substrate.

12 Claims, 4 Drawing Sheets

(51) Int. Cl.
*H01L 33/50* (2010.01)
*H01L 33/44* (2010.01)
(52) U.S. Cl.
CPC ............... *H01L 2933/0041* (2013.01); *H01L 2933/0058* (2013.01)

(56) References Cited

U.S. PATENT DOCUMENTS

| | | | |
|---|---|---|---|
| 8,110,421 B2 | 2/2012 | Sugizaki et al. | |
| 8,377,725 B2 | 2/2013 | Fujitomo et al. | |
| 9,024,340 B2 | 5/2015 | Minato et al. | |
| 2005/0046021 A1* | 3/2005 | Hosokawa | H01L 21/561 257/729 |
| 2006/0055309 A1 | 3/2006 | Ono et al. | |
| 2007/0085105 A1 | 4/2007 | Beeson et al. | |
| 2007/0284565 A1 | 12/2007 | Leatherdale et al. | |
| 2008/0054287 A1 | 3/2008 | Oshio et al. | |
| 2010/0327303 A1 | 12/2010 | Cheng | |
| 2011/0012149 A1* | 1/2011 | Basin | H01L 33/60 257/98 |
| 2011/0062469 A1 | 3/2011 | Camras et al. | |
| 2011/0175518 A1* | 7/2011 | Reed | F21V 7/05 313/483 |
| 2011/0242845 A1 | 10/2011 | Hong et al. | |
| 2011/0248287 A1* | 10/2011 | Yuan | H01L 33/60 257/88 |
| 2012/0112220 A1* | 5/2012 | West | H01L 33/46 257/98 |
| 2012/0217527 A1* | 8/2012 | Ito | H01L 33/46 257/98 |
| 2013/0037842 A1* | 2/2013 | Yamada | H01L 33/60 257/98 |

FOREIGN PATENT DOCUMENTS

| | | | |
|---|---|---|---|
| CN | 101878540 A | 11/2010 | |
| JP | 2011-060966 A | 3/2011 | |
| JP | WO 2011099384 A1 * | 8/2011 | ............ H01L 24/48 |
| JP | 2012-174703 A | 9/2012 | |
| JP | 2012-253223 A | 12/2012 | |
| WO | 2013/112691 A2 | 8/2013 | |

OTHER PUBLICATIONS

PCT/IB2014/061448 filed May 15, 2014, International Preliminary Report on Patentability dated Nov. 17, 2015, Written Opinion of the International Searching Authority 8 pages.

Article 94(3) EPC issued Jan. 18, 2017, European Patent Application No. 14729051.4-1551, 4 pages.

CN First Office Action dated May 4, 2017, China Patent Application No. 201480040421.5, 18 pages.

* cited by examiner

LIGHT EMITTING DEVICE WITH AN OPTICAL ELEMENT AND A REFLECTOR

The present application is a § 371 application of International Application No. PCT/IB2014/061448 filed on May 15, 2014 and entitled "Light emitting device with an optical element and a reflector," which claims the benefit of U.S. Provisional Application Ser. No. 61/823,419, filed on May 15, 2013.

FIELD OF THE INVENTION

The present invention relates to a lighting device with an optical element and a reflector on the bottom of the optical element.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

Figure 1:
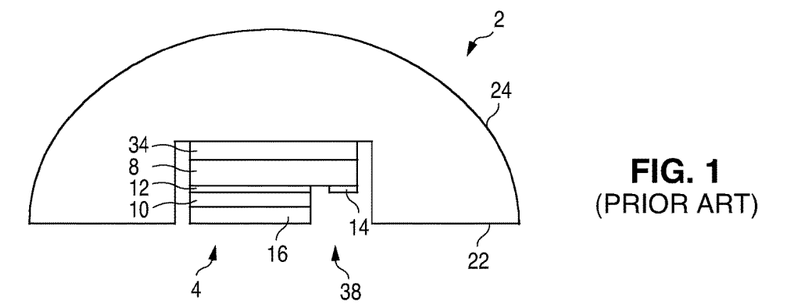
FIG. 1 illustrates a light emitter disposed in a recess of an optical element.

FIG. 1 illustrates a device described in more detail in U.S. Pat. No. 7,009,213 which is incorporated herein by reference. A light emitter 4 is located in a recess 38 in a surface 22 of an optical element 2 to which light emitter 4 is bonded. The optical element 2 is directly bonded to light emitter 4. Light emitter 4 includes a stack of semiconductor layers and an active region, capable of emitting light. The stack of semiconductor layers is attached to a transparent superstrate 34 formed from a material such as, for example, sapphire, SiC, GaN, AlN, or GaP. Light emitter 4 includes a first semiconductor layer 8 of n-type conductivity and a second semiconductor layer 10 of p-type conductivity. Semiconductor layers 8 and 10 are electrically coupled to active region 12. Active region 12 is, for example, a p-n diode junction associated with the interface of layers 8 and 10. Alternatively, active region 12 includes one or more semiconductor layers that are doped n-type or p-type or are undoped. Active region 12 can also include quantum wells. N-contact 14 and p-contact 16 are electrically coupled to semiconductor layers 8 and 10, respectively. Active region 12 emits light upon application of a suitable voltage across contacts 14 and 16. Optical element 2 is bounded by surface 24. The shape of surface 24 reduces the reflection of light emitted by light emitter 4.

SUMMARY

It is an object of the invention to provide a lighting device with an optical element and a reflector on the bottom of the optical element.

A structure according to embodiments of the invention includes a semiconductor light emitting device and an optical element disposed over the semiconductor light emitting device. The semiconductor light emitting device is disposed in a recess in the optical element. A reflector is disposed on a bottom surface of the optical element.

A method according to embodiments of the invention includes disposing a semiconductor light emitting device on a substrate and forming a reflector adjacent the semiconductor light emitting device. An optical element is formed over the semiconductor light emitting device. The semiconductor light emitting device is removed from the substrate.

DETAILED DESCRIPTION

In embodiments of the invention, a reflector is disposed on a bottom surface of an optical element optically coupled to a semiconductor light emitting device such as an LED. The reflective coating may minimize the incidence of light from the LED onto the mount to which the LED is attached. Accordingly, mounts with relatively low reflectivities may be used without adversely impacting light extraction from the system. For example, the LED may be attached to a mount such as a printed circuit board via solder attach. Such mounts often include, on the top surface of the mount on which the LED is mounted, a low-reflectivity solder masks.

Though in the examples below the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 2:
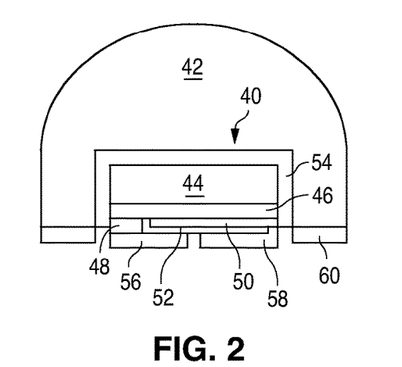
FIG. 2 illustrates a light emitting device including an LED, a lens, and a reflective material disposed on a bottom of a lens.

FIG. 2 illustrates a device according to embodiments of the invention. An optical element 42 such as a dome lens is disposed over a semiconductor light emitting device 40 such as an LED.

LED 40 may be, for example, a flip chip III-nitride light emitting device where the growth substrate is removed or remains part of the device. LED 40 may, for example, emit light having an UV or blue peak wavelength, or any other suitable peak wavelength. The bottom surface of LED 40 is often solderable to another structure, such as a printed circuit board. Any suitable light emitting device 40 may be used.

In the example LED illustrated in FIG. 2, LED 40 includes a semiconductor structure 46 grown on a growth substrate 44, which may be any suitable substrate such as, for example, sapphire, SiC, Si, GaN, glass, or composite substrates. The semiconductor structure includes a light emitting or active region sandwiched between n- and p-type regions. An n-type region may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick light emitting layers separated by barrier layers. A p-type region may then be grown over the light emitting region. Like the n-type region, the p-type region may include multiple layers of different composition, thickness, and dopant concentration, including layers that are not intentionally doped, or n-type layers. The total thickness of all the semiconductor material in the device is less than 10 µm in some embodiments and less than 6 µm in some embodiments. In some embodiments the p-type region is grown first, followed by the active region, followed by the n-type region. In some embodiments, the semiconductor material may optionally be annealed at between 200° C. and 800° C. after growth.

The metal contact 50 on the p-type region is then formed. Contact 50 may include a reflective metal such as, for example, silver. Contact 50 may include other metal layers such as, for example, a layer that makes Ohmic contact to the p-type III-nitride material and/or a guard layer that prevents electromigration of the reflective metal. After forming p-contact 50, for each LED on a wafer of LEDs, portions of the p-contact 50, the p-type region, and the active region in the semiconductor structure 46 are removed to expose a portion of the n-type region on which a metal n-contact 48 is formed. The p- and n-contacts 50 and 48 may be redistributed. For example, one or more dielectric layers 52 are formed which electrically isolate the p- and n-contacts 50 and 48. Openings are formed in the dielectric layer 52 where metal p-bonding pad 58 and n-bonding pad 56 will electrically connect to p- and n-contacts 50 and 48. A metal layer is formed over the dielectric layer 52, then the metal layer is patterned to form p-bonding pad 58 and n-bonding pad 56.

In the LED 40 of FIG. 2, a majority of light extracted from the LED is extracted through the top and sides of transparent substrate 44. The semiconductor structure 46 is supported by growth substrate 44, which remains part of the device. In some embodiments, the growth substrate 44 is removed from the device or thinned, and the semiconductor structure is supported by another structure such as a host substrate bonded to the semiconductor structure or thick metal p- and n-bonding pads 58 and 56 formed on the n- and p-contacts 48 and 50. Any suitable light emitting device may be used and the invention is not limited to the device illustrated in FIG. 2.

A wavelength converting material is disposed over LED 40. In the embodiment illustrated in FIG. 2, a wavelength converting layer 54 is disposed over LED 40 between LED 40 and lens 42. Wavelength converting layer 54 may be any suitable structure. For example, wavelength converting layer 54 may include one or more wavelength converting materials disposed in a transparent material. The wavelength converting material(s) absorb light emitted by LED 40 and emit light of a different wavelength. Unconverted light emitted by LED 40 is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light emitted from the structure.

The wavelength converting material(s) in wavelength converting layer 54 may be conventional phosphors, organic phosphors, quantum dots, organic semiconductors, II-VI or III-V semiconductors, II-VI or III-V semiconductor quantum dots or nanocrystals, dyes, polymers, or materials that luminesce. Any suitable powder phosphor may be used, including but not limited to garnet-based phosphors such as $Y_3Al_5O_{12}$:Ce (YAG), $Lu_3Al_5O_{12}$:Ce (LuAG), $Y_3Al_{5-x}Ga_xO_{12}$:Ce (YAlGaG), $(Ba_{1-x}Sr_x)SiO_3$:Eu (BOSE), and nitride-based phosphors such as $(Ca,Sr)AlSiN_3$:Eu and $(Ca,Sr,Ba)_2Si_5N_8$:Eu.

Wavelength converting materials in wavelength converting layer 54 may be mixed with a transparent material which may be, for example, silicone, epoxy, glass, or any other suitable material. Wavelength converting layer 54 may be formed by screen printing, spray coating, stenciling, molding, laminating, or any other suitable technique. Wavelength converting layer may be a pre-formed, rigid structure such as a ceramic wavelength converting member or a pre-formed slab of wavelength converting material disposed in glass or other rigid, transparent material. Wavelength converting layer 54 may include a single wavelength converting material, a mixture of wavelength converting materials, or multiple wavelength converting materials formed as separate layers rather than mixed together. Wavelength converting materials emitting different colors of light may be disposed in separate regions or mixed together.

In one example, red- and green-emitting powder phosphors are mixed with silicone. The mixture is cast into a film. The phosphor materials and amounts of phosphor mixed into the silicone may be selected to complement the blue light emitted by LED 40, such that the mixed blue, green, and red light meets the specification for a given application. The phosphor-loaded silicone film is laminated over LED 40.

In some embodiments, wavelength converting material may be disposed within or on a surface of lens 42 rather than, or in addition to, in the coating 54 disposed over LED 40.

Optical element 42 is a structure that may alter the pattern of light emitted by LED 40. Examples of suitable optical elements include lenses such as dome lenses and Fresnel lenses, and other structures such as optical concentrators. The diameter or lateral extent of the device including LED 40 and optical element 42 is at least 1.5 times the diameter or lateral extent of LED 40 in some embodiments and no more than 4 times the diameter or lateral extent of LED 40 in some embodiments. Optical element 42 often extends over the sides of LED 40 as illustrated in FIG. 2. Optical element 42 may be the sole mechanical connection between optical element 42 and LED 40—i.e., optical element may mold over LED 40 to connect optical element 42 to LED 40, without a mount or substrate supporting both LED 40 and optical element 42.

A reflector 60 is disposed on at least a portion of a bottom surface of optical element 42. Reflector 60 may be a specular reflector, such as, for example, a reflective metal foil. Examples of suitable metals include aluminum and silver. Any suitable material that is reflective of the wavelengths emitted by the structure may be used. A reflective material that is a solder-wettable metal, in applications where solder is used to attach LED 40 to another structure, may have a non-wettable material, such as a native oxide of the reflective material or a layer of organic material, formed on the surface opposite the optical element. The bottom surface of the reflector 60 on the bottom surface of optical element 42 may be at the same elevation as the bottom surface of LED 40. The reflector 60 may be made of a material with a lower refractive index than optical element 42.

The device illustrated in FIG. 2 may be formed according to the method illustrated in FIGS. 3, 4, 5, 6, 7, and 8.

Figure 3:
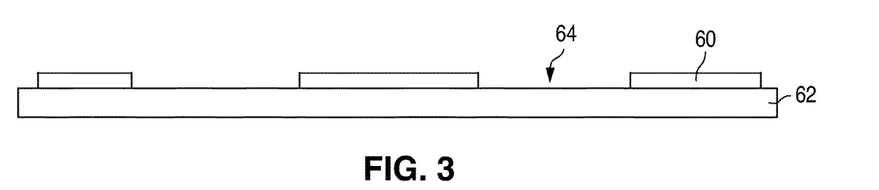
FIG. 3 illustrates a reflective material disposed on a substrate.

In FIG. 3, reflective regions 60 are formed on a carrier substrate 62. Substrate 62 may be, for example, carrier tape such as standard semiconductor dicing tape, bin tape, silicone tape, polyethylene terephthalate (PET) tape, polyimide tape, or any other suitable material. Substrate 62 may have a thin temporary glue layer to hold reflective regions 60 in place during processing. Reflective regions 60 may be formed by roll-laminating a reflective metal foil onto substrate 62. A suitable reflective metal foil may be, for example, at least 0.1 μm thick in some embodiments and no more than 30 μm thick in some embodiments. Before or after attaching reflective foil to substrate 62, openings 64 may be formed in the reflective foil. Openings 64 may be formed by any suitable technique such as punching or cutting the reflective metal foil.

Figure 4:
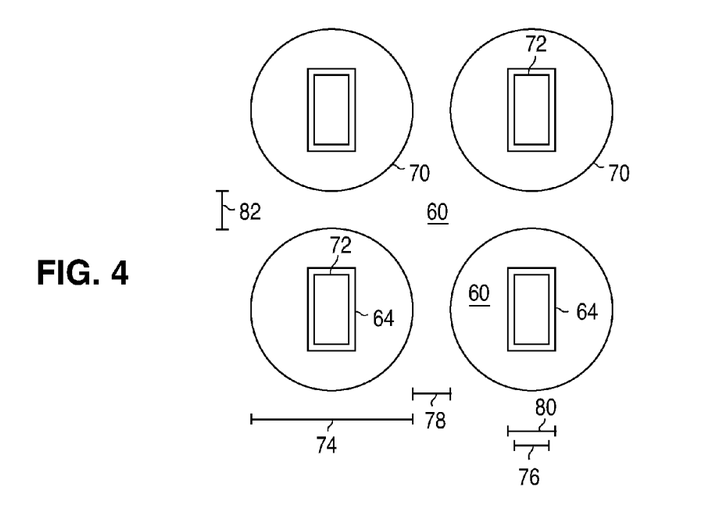
FIG. 4 illustrates the arrangement of four LEDs and four optical elements.

Openings 64 may correspond to the size, shape, and spacing of multiple LEDs 40, as illustrated in FIG. 4. In FIG. 4, openings 64 in a reflective foil for an exemplary group of four LEDs are shown. The extent of optical element 42 on the bottom surface is illustrated by circles 70. The footprints 72 of LEDs 40 are shown positioned substantially in the center of optical elements 70. Though LEDs with rectangular footprints 72 and optical elements with round footprints 70 are shown, any suitably shaped LEDs and optical elements may be used. The width 80 of openings 64 may be wider than the width 76 of footprint 72 by at least 25 μm in some embodiments and no more than 400 μm in some embodiments. Openings 64 may be arranged, for example, in a rectangular array as illustrated in FIG. 4, in a hexagonal array, or in any other suitable arrangement. As described above, the width 74 of the base 70 of each optical element is between 1.5 times and 4 times the width 76 of the LED, in some embodiments. The spacing 78 between neighboring optical elements 70 may be at least 30 μm in some embodiments and no more than 100 μm in some embodiments, to allow for singulating individual optical elements 70. The spacing 78 between nearest neighbor optical elements on the x-axis may differ from the spacing 82 between nearest neighbor optical elements on the y-axis. The areas 60 between openings 64, both beneath optical elements 70 and between optical elements, are occupied by reflective foil.

Figure 5:
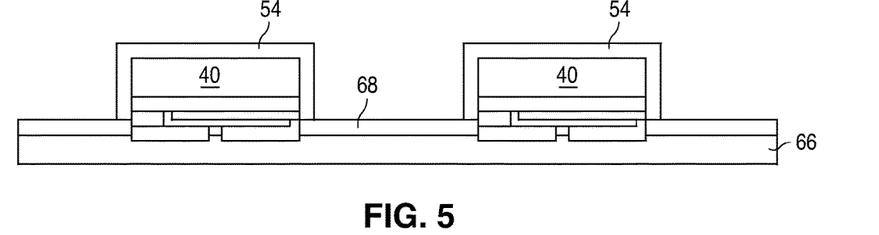
FIG. 5 illustrates two LEDs attached to a substrate with a wavelength converting material disposed over the LEDs.

In FIG. 5, separate from the process illustrated in FIG. 3, LEDs 40 are fabricated, as described above. LEDs 40 are then attached to a carrier substrate 66, which may be any of the materials listed above for substrate 62. A wavelength converting layer 54 is disposed over LEDs 40. In some embodiments, one or more wavelength converting materials are disposed in a flexible material such as silicone, then the flexible wavelength converting layer 54 is laminated over the LEDs 40. Wavelength converting layer 54 may be at least 20 μm thick in some embodiments, no more than 200 μm thick in some embodiments, at least 50 μm thick in some embodiments, and no more than 100 μm thick in some embodiments. Wavelength converting layer 54 may be a conformal layer that extends over the sides of LEDs 40, such that wavelength converting layer 54 has a substantially constant thickness. In the alternative, the thickness of the wavelength convert layer 54 on the sides of LEDs 40 may be different than the thickness on the top of LEDs 40. The wavelength converting material in layer 54 may be powder phosphor in some embodiments. Suitable powder phosphors may have a particle diameter of at least 5 μm in some embodiments, no more than 100 μm in some embodiments, at least 20 μm in some embodiments, and no more than 40 μm in some embodiments. The wavelength converting material in layer 54 may be semiconductor quantum dots or organic materials in some embodiments. Suitable quantum dots may have a particle diameter of no more than 10 μm in some embodiments.

After disposing wavelength converting layer 54 over LEDs 40, the wavelength converting layer 54 may be diced to remove the portion 68 of the wavelength converting layer 54 between LEDs 40. In some embodiments, wavelength converting layer 54 may be omitted.

Figure 6:
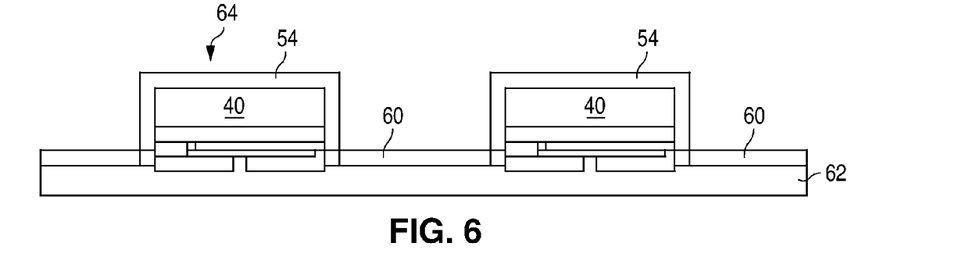
FIG. 6 illustrates the LEDs of FIG. 5 disposed on the substrate illustrated in FIG. 3.

In FIG. 6, the LEDs are removed from the substrate 66 of FIG. 5 and positioned on substrate 62 of FIG. 3 in the openings 64 between reflective regions 60.

Figure 7:
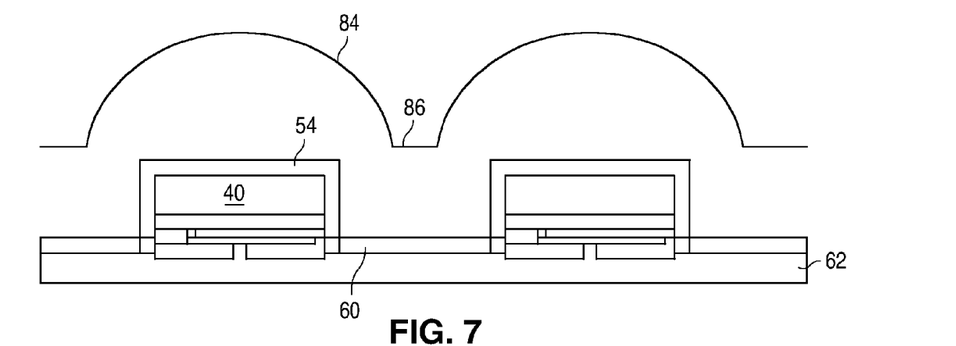
FIG. 7 illustrates molding optical elements over the structure illustrated in FIG. 6.

In FIG. 7, optical elements are formed over LEDs 40. Optical elements may be disposed over LEDs 40 in any suitable manner. For example, pre-formed optical elements may be glued over LEDs 40. In the alternative, as illustrated in FIG. 7, a mold 84 with features corresponding to individual optical elements is lowered over the structure illustrated in FIG. 6. An area 86 between neighboring optical elements facilitates singulation (e.g. sawing, laser singulation, or any other suitable technique) of the molded optical elements. Mold 84 may be metal in some embodiments. A thin non-stick film, having the general shape of mold 84 (not shown in FIG. 7), may be placed or formed over mold 84. The non-stick film is a conventional material that prevents the sticking of molding material to the mold 84, and is not needed if the molding material does not stick to the mold. In some embodiments, plasma such as $O_2$ plasma is applied to the top surface of the structure illustrated in FIG. 6, to improve the adhesion of the molding material to the LEDs.

The region between mold 84 and the structure illustrated in FIG. 6 is then filled with a heat-curable liquid molding material. The molding material may be any suitable optically transparent material such as silicone, an epoxy, or a hybrid silicone/epoxy. A hybrid may be used to more closely match the coefficient of thermal expansion (CTE) of the molding material to that of the LED 40. Silicone and epoxy have a sufficiently high index of refraction (greater than 1.4) to facilitate light extraction from LEDs 40 as well as act as a lens. One type of silicone has an index of refraction of 1.76. In some embodiments, a wavelength converting material such as phosphor is dispersed in the molding material. An optical element with dispersed wavelength converting material may be used instead of or in addition to wavelength converting layer 54 illustrated in FIG. 7.

A vacuum seal may be created between the periphery of the substrate 62 and mold 84, and the two pieces may be pressed against each other so that each LED die 40 is inserted into the liquid molding material and the molding material is under compression. The mold 84 may then be heated, for example to about 150° C. or other suitable temperature for a suitable time to harden the molding material.

Figure 8:
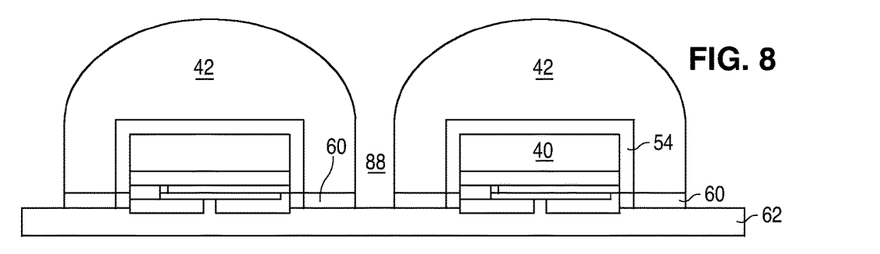
FIG. 8 illustrates two devices after the molding illustrated in FIG. 7.

In FIG. 8, the molded devices are separated from the mold and singulated. A non-stick film in embodiments where used may cause the resulting hardened optical elements to be easily released from the mold. The non-stick film is then removed. Individual devices may be singulated by cutting any molding material and reflective foil 60 in the region 88 between devices. The devices can then be removed from substrate 62.

LEDs 40 are attached to optical elements 42 only through the top and sides of LEDs 40—i.e. there is no support substrate or mount that supports both the LED 40 and optical element 42. In the final device, LED 40 is positioned in a recess in optical element 42 and the bottom surfaces of reflective regions 60 and LED 40 are substantially coplanar, meaning they are at substantially the same elevation. The bottom surfaces of reflective regions 60 and LED 40 need not be precisely coplanar, as illustrated in FIG. 8, though they may be.

Figure 9:
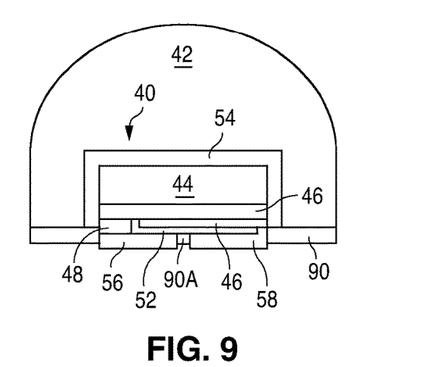
FIG. 9 illustrates a light emitting device including an LED, a lens, and a reflective material disposed on a bottom of a lens.

FIG. 9 illustrates a device according to embodiments of the invention. An optical element 42 such as a dome lens is disposed over a semiconductor light emitting device 40 such as an LED. The device illustrated in FIG. 9 differs from the device illustrated in FIG. 2 in that the reflective material 90 disposed on the bottom surface of optical element 42 is a diffuse reflector in some embodiments, rather than a specular reflector 60 as in FIG. 2. In addition, in some embodiments, reflective material 90A is disposed between p-bonding pad 58 and n-bonding pad 56 on the bottom of LED 40.

Figure 10:
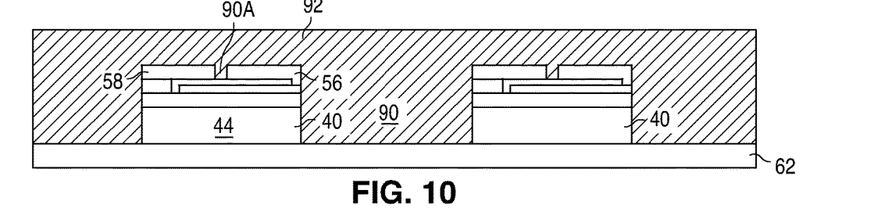
FIG. 10 illustrates two LEDs attached to a substrate and a reflective material disposed over the LEDs.

The device illustrated in FIG. 9 may be formed according to the method illustrated in FIGS. 10, 11, 12, 13, and 14. In FIG. 10, LEDs 40 are fabricated, as described above. LEDs 40 are then attached to a carrier substrate 62, which may be any of the materials listed above for substrates 62 and 66 of FIGS. 3 and 5. LEDs 40 are mounted on substrate 62 with p-bonding pad 58 and n-bonding pad 56 oriented away from substrate 62. A reflective material 90 is molded or laminated over LEDs 40. Reflective material 90 may be a diffuse reflector. Any suitable high refractive index, low absorption material may be used as a reflective material 90. One example of a suitable reflective material is reflective particles such as $TiO_2$ embedded in or mixed with a transparent material such as silicone. At least 10% of the volume of reflective material 90 may be reflective particles in some embodiments, no more than 30% of the volume of reflective material 90 may be reflective particles in some embodiments, at least 10% of the weight of reflective material 90 may be reflective particles in some embodiments, and no more than 30% of the weight of reflective material 90 may be reflective particles in some embodiments. In some embodiments, the reflective particles have a high refractive index, while the transparent material in which the reflective particles are disposed has a low refractive index. The reflectivity of the reflective material (i.e. the mixture of the reflective particles and the transparent material) depends on the refractive indices of both materials. Other things may be added to the reflective material, or the reflective particles and transparent material may be changed, to adjust the thermal expansion and mechanical stability of the reflective material. As illustrated in FIG. 10, reflective material 92 may be disposed over the tops of LEDs 40 and a portion, 90A, of the reflective material 92 may be disposed between p-bonding pad 58 and n-bonding pad 56. Likewise a portion, 90, of the reflective material 92 may be disposed between devices.

Figure 11:
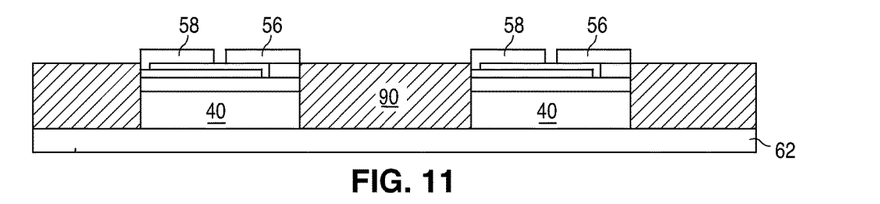
FIG. 11 illustrates the structure of FIG. 10 after thinning the reflective material.

In FIG. 11, the reflective material over the tops of LEDs 40 is removed to reveal p-bonding pad 58 and n-bonding pad 56. Any suitable removal technique may be used. In some embodiments, excess reflective material is removed by ablation (micro-bead blasting) with a particle with an appropriate hardness to erode reflective material 92 without damaging the surfaces of LED 40. For example, sodium carbonate particles in a compressed air stream may be used to remove excess reflective material. Reflective material between p-bonding pad 58 and n-bonding pad 56 may be removed, as illustrated in FIG. 11, though it need not be, as illustrated in FIG. 9. In some embodiments, excess material is removed by grinding. Grinding may remove a small portion of the thickness of contacts 56 and 58 in addition to excess reflective material. After removing excess reflective material, the remaining reflective material 90 may be flush with the top surface of LEDs 40 or the remaining reflective material 90 may be at a lower elevation than the top surface of LEDs 40, as illustrated in FIG. 11.

Figure 12:
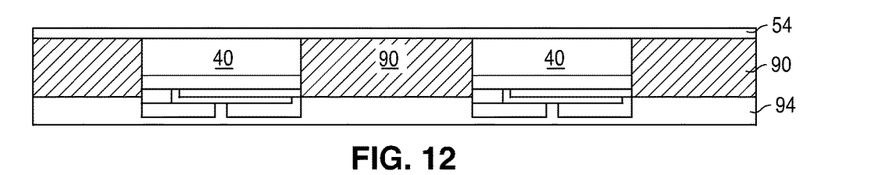
FIG. 12 illustrates the structure of FIG. 11 after attaching the structure to a second substrate, removing the first substrate, and forming a wavelength converting layer over the LEDs.

In FIG. 12, the structure illustrated in FIG. 11 is flipped over and mounted on a substrate 94, which may be any of the materials listed above for substrates 62 and 66. The p-bonding pad 58 and n-bonding pad 56 may be connected to indentations in substrate 94, as illustrated in FIG. 12, or on p-bonding pad 58 and n-bonding pad 56 may be connected to the surface of substrate 94. A wavelength converting layer 54 is disposed over LEDs 40. Wavelength converting layer 54 may be the same materials and formed in the same way as described above, for example in the text accompanying FIG. 5. In some embodiments, sufficient reflective material 90 remains between LEDs 40 such that wavelength converting layer 54 does not extend over the sides of LEDs 40, as illustrated in FIG. 12. In some embodiments, enough reflective material 90 between the LEDs 40 is removed such that wavelength converting layer 54 extends over the sides of LEDs 40, as illustrated in FIG. 9.

Figure 13:
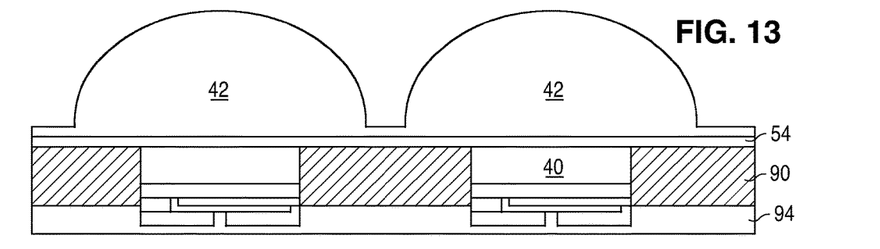
FIG. 13 illustrates the structure of FIG. 12 after forming optical elements over the LEDs.
Figure 15:
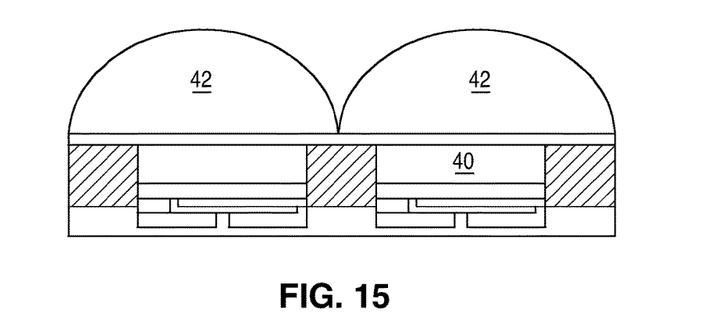
FIGS. 15 and 16 illustrate optical elements disposed over LEDs where the optical elements are substantially the same width as the LEDs.
Figure 16:
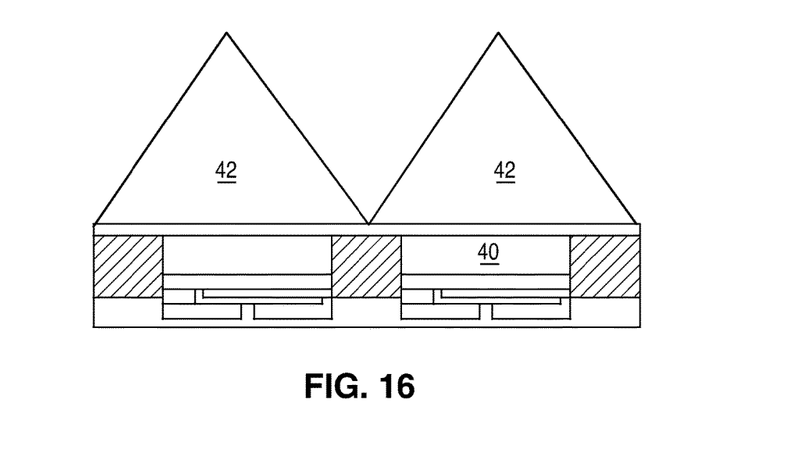

In FIG. 13, individual optical elements 42 are formed over LEDs 40. Optical elements 42 may be the same materials and formed in the same way as described above, for example in the text accompanying FIGS. 7 and 8. In some embodiments, the width of optical elements 42 is substantially the same as the width of LEDs 40, or less than the minimum 1.5 times the width of the LED described above in reference to FIG. 4. FIGS. 15 and 16 illustrate two examples of optical elements 42 that are substantially the same width as LEDs 40. In the structure illustrated in FIG. 15, the optical elements 42 are dome lenses. In the structure illustrated in FIG. 16, the optical elements 42 are pyramids.

Figure 14:
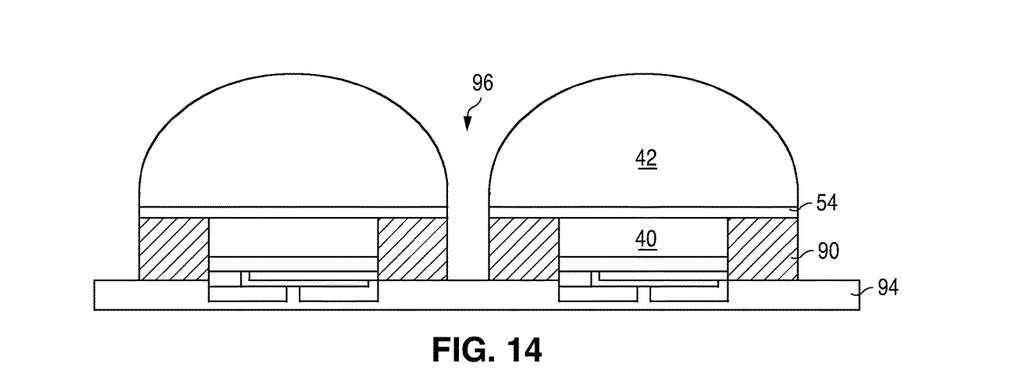
FIG. 14 illustrates the structure of FIG. 13 after singulating the LEDs.

In FIG. 14, the devices are singulated, for example by cutting any molding material, wavelength converting material, and reflective material in the region 96 between devices. The devices can then be removed from substrate 94. The finished devices can be mounted on a structure such as a PC board, for example by soldering.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A method comprising:
   disposing a reflective foil on a substrate, the reflective foil having an opening;
   disposing a semiconductor light emitting device on the substrate, the semiconductor light emitting device being disposed in the opening of the reflective foil;
   forming an optical element over the semiconductor light emitting device such that the reflective foil is in contact with a full length of a base of the optical element; and
   removing the semiconductor light emitting device from the substrate.

2. The method of claim 1 wherein forming an optical element over the semiconductor device comprises molding a lens over the semiconductor light emitting device after disposing the semiconductor light emitting device in the opening.

3. The method of claim 1 wherein the semiconductor light emitting device is disposed in a recess in the optical element.

4. The method of claim 1 further comprising laminating a wavelength converting layer over the semiconductor light emitting device.

5. The method of claim 4 wherein the wavelength converting layer covers a top surface and at least one side surface of the semiconductor light emitting device.

6. The method of claim 1 wherein disposing a reflective foil on a substrate comprises roll-laminating a metal foil on the substrate.

7. The method of claim 6 further comprising forming the opening before said roll-laminating.

8. The method of claim 1 further comprising forming the opening before said disposing a reflective foil on a substrate.

9. The method of claim 1 further comprising forming the opening after said disposing a reflective foil on a substrate.

10. The method of claim 1 wherein the reflective foil is between 0.1 and 30 microns thick.

11. The method of claim 1 further comprising forming the opening by punching the reflective foil.

12. The method of claim 1 further comprising forming the opening by cutting the reflective foil.

* * * * *